US012804824B2

(12) United States Patent
Lam et al.

(10) Patent No.: US 12,804,824 B2
(45) Date of Patent: Nov. 17, 2026

(54) DISPLAY DEVICE MODULARIZATION KIT, INFORMATION SYSTEM MODULARIZATION KIT, AND INFORMATION SYSTEM

(71) Applicant: FLYTECH TECHNOLOGY CO., LTD., Taipei City (TW)

(72) Inventors: Tai-Seng Lam, Taipei City (TW); Ping-Kun Hsu, Taipei City (TW)

(73) Assignee: FLYTECH TECHNOLOGY CO. , LTD., Taipei City (TW)

( * ) Notice: Subject to any disclaimer, the term of this patent is extended or adjusted under 35 U.S.C. 154(b) by 181 days.

(21) Appl. No.: 18/647,028

(22) Filed: Apr. 26, 2024

(65) Prior Publication Data

US 2025/0247968 A1 Jul. 31, 2025

(30) Foreign Application Priority Data

Jan. 26, 2024 (TW) ................................ 113103197

(51) Int. Cl.
*H05K 5/02* (2006.01)
*H05K 5/00* (2006.01)

(52) U.S. Cl.
CPC ......... *H05K 5/0065* (2013.01); *H05K 5/0204* (2013.01); *H05K 5/026* (2013.01)

(58) Field of Classification Search
CPC .... H05K 5/0065; H05K 5/0204; H05K 5/026; G06F 2200/1612; G06F 1/1601; G06F 1/1683; G09F 9/00; H01R 13/629; H01R 27/00; H01R 13/514; H01R 33/00; H04Q 1/30
See application file for complete search history.

(56) References Cited

U.S. PATENT DOCUMENTS

2011/0216493 A1* 9/2011 Zheng ..................... G06F 1/203 361/679.21
2013/0135814 A1* 5/2013 Lee ......................... G06F 1/184 361/679.33

(Continued)

FOREIGN PATENT DOCUMENTS

CN 206400683 U * 8/2017
WO WO-2011068396 A2 * 6/2011 ........... G06F 1/1643

*Primary Examiner* — Adrian S Wilson

(74) *Attorney, Agent, or Firm* — Demian K. Jackson; Jackson IPG PLLC

(57) ABSTRACT

The present invention relates to a display device modularization kit, which provides a modularized physical linkage and a unified communication connection for a frontend module with different specifications and a separable control box module with different specifications. The display device modularization kit includes: a multi-specification mounting module configured to link a display component with different specifications to form the frontend module; and a unified communication connection module including a first connector and a single transmission line, wherein the first connector is configured to communicatively connect with an internal display port with different specifications included in the display component and the single transmission line is configured to communicatively connect with a single internal communication connector included in the separable control box module.

10 Claims, 11 Drawing Sheets

(56) References Cited

U.S. PATENT DOCUMENTS

| | | | | |
|---|---|---|---|---|
| 2014/0028923 | A1* | 1/2014 | Griffin | G06F 1/1601<br>348/839 |
| 2019/0212609 | A1* | 7/2019 | Nitanai | G02F 1/133608 |
| 2021/0215896 | A1* | 7/2021 | Zanetti | G02B 6/4277 |

* cited by examiner

DISPLAY DEVICE MODULARIZATION KIT, INFORMATION SYSTEM MODULARIZATION KIT, AND INFORMATION SYSTEM

CROSS-REFERENCE TO RELATED APPLICATION

This application claims priority benefit to Taiwan Invention Patent Applications No. 113103197, filed on Jan. 26, 2024, in Taiwan Intellectual Property Office, the entire disclosures of which are incorporated by reference herein.

FIELD

The present invention relates to a display device modularization kit, information system modularization kit, and information system, in particular to a display device modularization kit, information system modularization kit, and information system capable of offering a modularized physical linkage and a unified communication connection for a frontend module with different specifications and a separable control box module with different specifications.

BACKGROUND

In current conventional technology, the majority of flat panel displays commonly share a fixed pattern for structural layout. Typically, the layout is as follows: the flat panel display components are positioned at the front, facing the user, while components such as the controller and motherboard are hidden at the rear within a box-like enclosure. The advantage of this arrangement and layout is that components such as the controller and motherboard are shielded and hidden by the display components, resulting in a more streamlined appearance visually.

FIGS. 1 and 2 are schematic diagrams illustrating the basic structural layout for the conventional flat panel displays in the prior art. In the conventional technology, the front F of a flat panel display 1, which faces the user, is designated for the deployment of flat display components, with the display surface 2 oriented towards the user. The flat panel display 1 includes a back cover 3 at the back B, which the back cover contains a box-like housing 4, so as to deploy electronic circuit components such as controllers and motherboards.

The fixed pattern for structural layout as shown in FIGS. 1 and 2 is also extensively adopted in application-end information system terminals, such as point of sale (POS) machines, information kiosks, and self-checkout (SOC) machines, which employs this layout pattern for both displays and controllers.

The fixed pattern for structural layout in the conventional flat panel displays has a significant drawback. In the event of a malfunction, the user is forced to repurchase the entire device, as it is quite difficult to replace defective internal components individually. However, for many high-priced commercial displays or commercial application-end information system terminals, repurchasing is almost never an option when a display malfunctions. Usually, the failed device is returned to the manufacturer for repair or replacement of parts.

However, for the conventional flat panel display, since all the electronic components, from the flat panel display components, the controllers, to the motherboards, are sealed in the same housing, the maintenance and replacement of these electronic components are so difficult. In addition, the lack of modularity design among the components, the absence of a standardized communication interface, and, especially, the incompatibility among components from different brands, renders such a layout pattern lack flexibility and a certain degree of agility, which leads to difficulties in logistical maintenance operations, and sometimes, without adequate spare parts, repair may not even be possible.

Hence, there is a need to solve the above deficiencies/issues.

SUMMARY

The present invention relates to a display device modularization kit, information system modularization kit, and information system, in particular to a display device modularization kit, information system modularization kit, and information system capable of offering a modularized physical linkage and a unified communication connection for a frontend module with different specifications and a separable control box module with different specifications.

Accordingly, the present invention provides a display device modularization kit, which provides a modularized physical linkage and a unified communication connection for a frontend module with different specifications and a separable control box module with different specifications. The display device modularization kit includes: a multi-specification mounting module configured to link a display component with different specifications to form the frontend module; and a unified communication connection module including a first connector and a single transmission line, wherein the first connector is configured to communicatively connect with an internal display port with different specifications included in the display component and the single transmission line is configured to communicatively connect with a single internal communication connector included in the separable control box module.

The present invention further provides an information system modularization kit, which provides a modularized physical linkage and a unified communication connection for a frontend module with different specifications and a separable control box module with different specifications. The information system includes: a multi-specification mounting module configured to link a display component with different specifications to form the frontend module; and a unified communication connection module including a first connector and a single transmission line, wherein the first connector is configured to communicatively connect with an internal display port with different specifications included in the display component and the single transmission line is configured to communicatively connect with a single internal communication connector included in the separable control box module.

The present invention further provides an information system, which provides a modularized physical linkage and a unified communication connection for a frontend module with different specifications and a separable control box module with different specifications. The information system includes: a multi-specification mounting module configured to link a display component with different specifications to form the frontend module; and a unified communication connection module including a first connector and a single transmission line, wherein the first connector is configured to communicatively connect with an internal display port with different specifications included in the display component and the single transmission line is configured to communicatively connect with a single internal communication connector included in the separable control box module.

The above content described in the summary is intended to provide a simplified summary for the presently disclosed invention, so that readers are able to have an initial and basic understanding to the presently disclosed invention. The above content is not aimed to reveal or disclose a comprehensive and detailed description for the present invention, and is never intended to indicate essential elements in various embodiments in the present invention, or define the scope or coverage in the present invention.

DESCRIPTION OF THE DRAWINGS

A more complete appreciation according to the present invention and many of the attendant advantages thereof are readily obtained as the same become better understood by reference to the following detailed description when considered in connection with the accompanying drawing, wherein.

DETAILED DESCRIPTION

Figure 1:
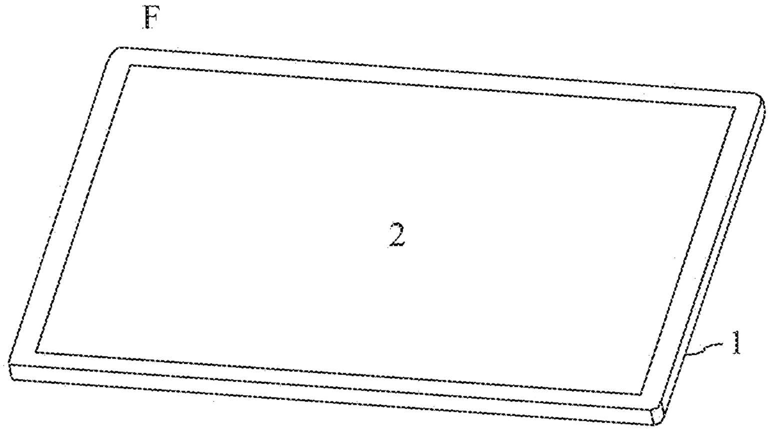
FIGS. 1 and 2 are schematic diagrams illustrating the basic structural layout for the conventional flat panel displays in the prior art.
Figure 2:
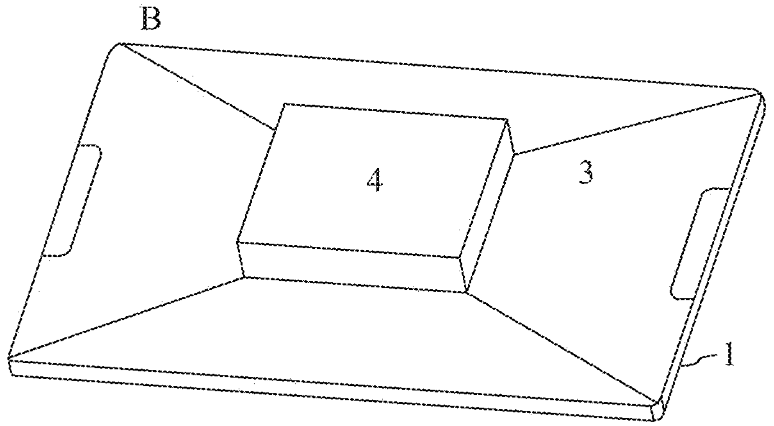

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice. It is clear that other embodiments can be configured according to the knowledge of persons skilled in the art without departing from the true technical teaching of the present disclosure, the claimed disclosure being limited only by the terms of the appended claims.

It is to be noticed that the term "including," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device including means A and B" should not be limited to devices consisting only of components A and B.

Figure 3:
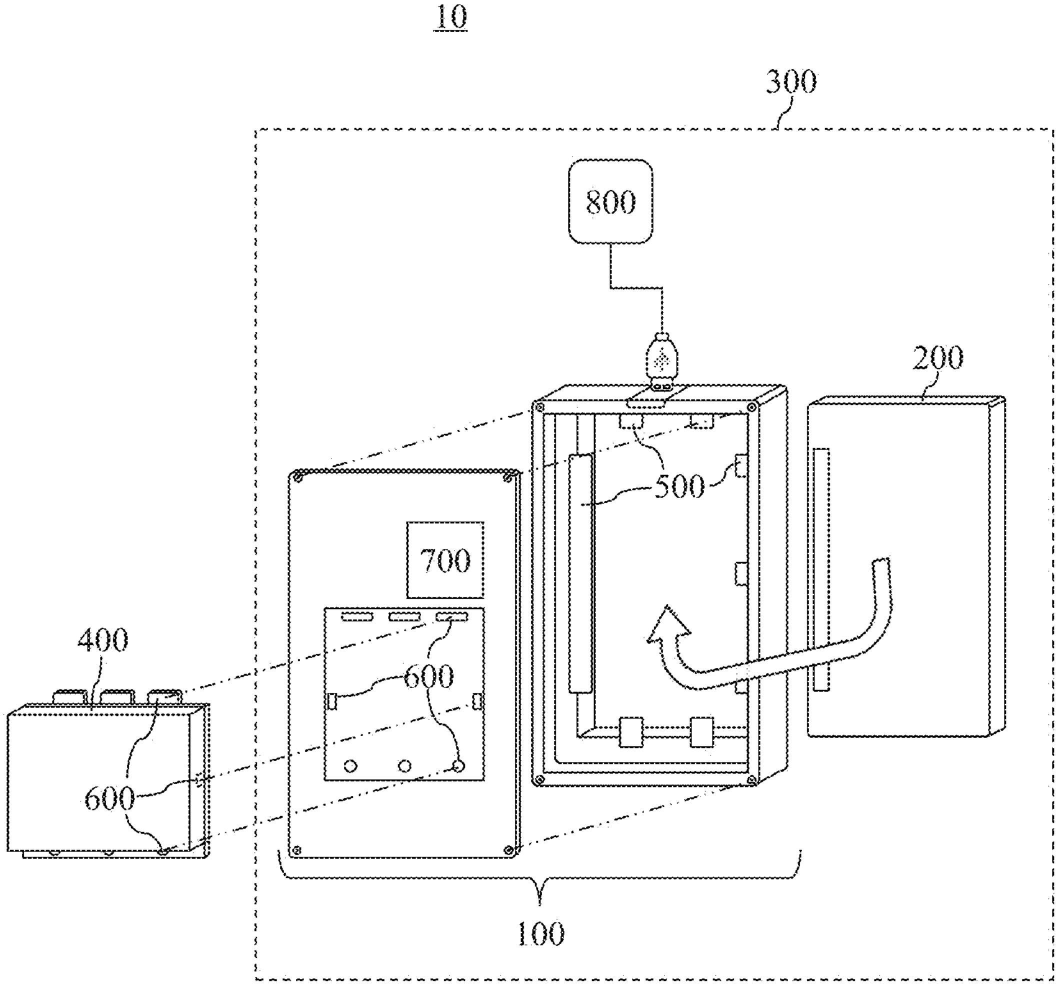
FIG. 3 is a schematic diagram illustrating the system architecture for an application-end information system included in the present invention.

FIG. 3 is a schematic diagram illustrating the system architecture for an application-end information system included in the present invention. The application-end information system 10 includes a display device modularization kit 100, a display component 200, a frontend module 300, a separable control box module 400, a multi-specification mounting module 500, a multi-specification linking module 600, and a unified communication connection module 700, etc, wherein the display device modularization kit 100 is configured to provide a physical linkage and a unified communication connection among a variety of display components 200 with different specifications and a variety of separable control box modules 400 with different specifications, so as to enable a variety of display components 200 and separable control box modules 400 with different specifications to form the physical linkages and the unified internal communication connections thereamong, and to enable a rapid replacement and combination for various display components 200 and separable control box modules 400 with different specifications, to form an application-end information system 10 having versatile and different functionalities.

Preferably, the different specifications refer to and cover multiple aspects including, but not limited to: different sizes, different brands, different operating principles, different architectures, different performances, different functionalities, different materials, or different sources.

As demonstrated by the display components 200 as an example, the display components 200 are preferably any display products with different specifications available on the market, covering a variety of touch screen products, a variety of touch display products, and a variety of flat panel display products. The different specifications include, but are not limited to: different sizes, different brands, different operating principles, different functionalities, or different sources. For example, the display components 200 with different sizes include, but are not limited to: the available display products with sizes of 10.1 inches, 11.6 inches, 13.3 inches, 14 inches, 15.1 inches, 15.6 inches, 17 inches, 18.5 inches, 21.5 inches, 27 inches, 28 inches to 32 inches, and so on. The display components 200 with different operating principles include, but are not limited to: the LCD display products, the OLED display products, the MicroLED display products, the AMOLED display products, and the plasma display products, etc.

A display product preferably refers to a display component that has a full display functionality but has not yet been electrically connected to an internal controller and has not been assembled with the external component, either the housing or the enclosure. As compared to the housing, the display component is preferably regarded as an internal component.

As demonstrated by the separable control box module 400 as an example, the separable control box modules 400 are preferably any control box products with different specifications available on the market. The different specifications include, but are not limited to: different operating principles or different functionalities. For example, the separable control box modules 400 with different operating principles include, but are not limited to: the control box products based on x86 or ARM architectures. The separable control box modules 400 with different functionalities include, but are not limited to: the control box products offering a point of sale (POS) functionality, a tablet PC (panel PC) functionality, an information kiosk (Kiosk) functionality, or a self-checkout (SOC) functionality.

A control box product refers to an independent control box component where the internal main control circuit board (the motherboard) has been assembled into the housing. The main control circuit board is pre-configured with different functionalities as needed and is capable of driving and controlling the display component 200, but it has not yet been physically linked or communicatively connected with the internal display component 200.

The multi-specification mounting module 500 included in the display device modularization kit 100 is used to receive the display components 200 with different specifications to be attached onto the display device modularization kit 100, to enable the display components 200 with different specifications to be physically linked with a variety of separable control box modules 400 with different specifications.

The multi-specification linking module 600 included in the display device modularization kit 100 is distributed and configured on both the display device modularization kit 100 and the separable control box module 400, and is used to physically link the separable control box modules 400 with different specifications to the display device modularization kit 100, so that the application-end information system 10 is capable of exchanging the different separable control box modules 400 with different specifications easily and simply.

By exchanging the separable control box modules 400 with different functionalities, the application-end information system 10 is versatilely transformed into a variety of application-end information terminal devices, which include, but are not limited to: POS terminals, tablet PCs, medical-grade tablet PCs, Kiosk stations, and SOC terminals.

Moreover, the display device modularization kit 100 is equipped with multiple communication connectors to enable the external connection with other peripheral devices 800. Such peripheral devices 800 include, but are not limited to, scanners, card readers, swipe card machines, NFC readers, fingerprint sensors, printers, cameras, mice, keyboards, speakers, smart buttons (iButtons), second displays, third displays, biometric identifiers, electronic payment devices, and the like.

After assembly, the display component 200, the display device modularization kit 100, and the peripheral devices 800 jointly form the half front part of the application-end information system 10, either the frontend module 300, and contribute to forming the primary visual exterior appearance for the application-end information system 10.

The display device modularization kit 100 further includes the unified communication connection module 700, which functions as the only communication channel between the frontend module 300 and the separable control box module 400 by means of using a single transmission line, so as to unify multiple communication interfaces between various display components 200 and various separable control box modules 400 with different specifications and to achieve a unified internal communication connection.

The display device modularization kit 100 is also known as an information system modularization kit, a display device integrated communication interface modularization kit, or an information system unified communication interface modularization kit.

Figure 4:
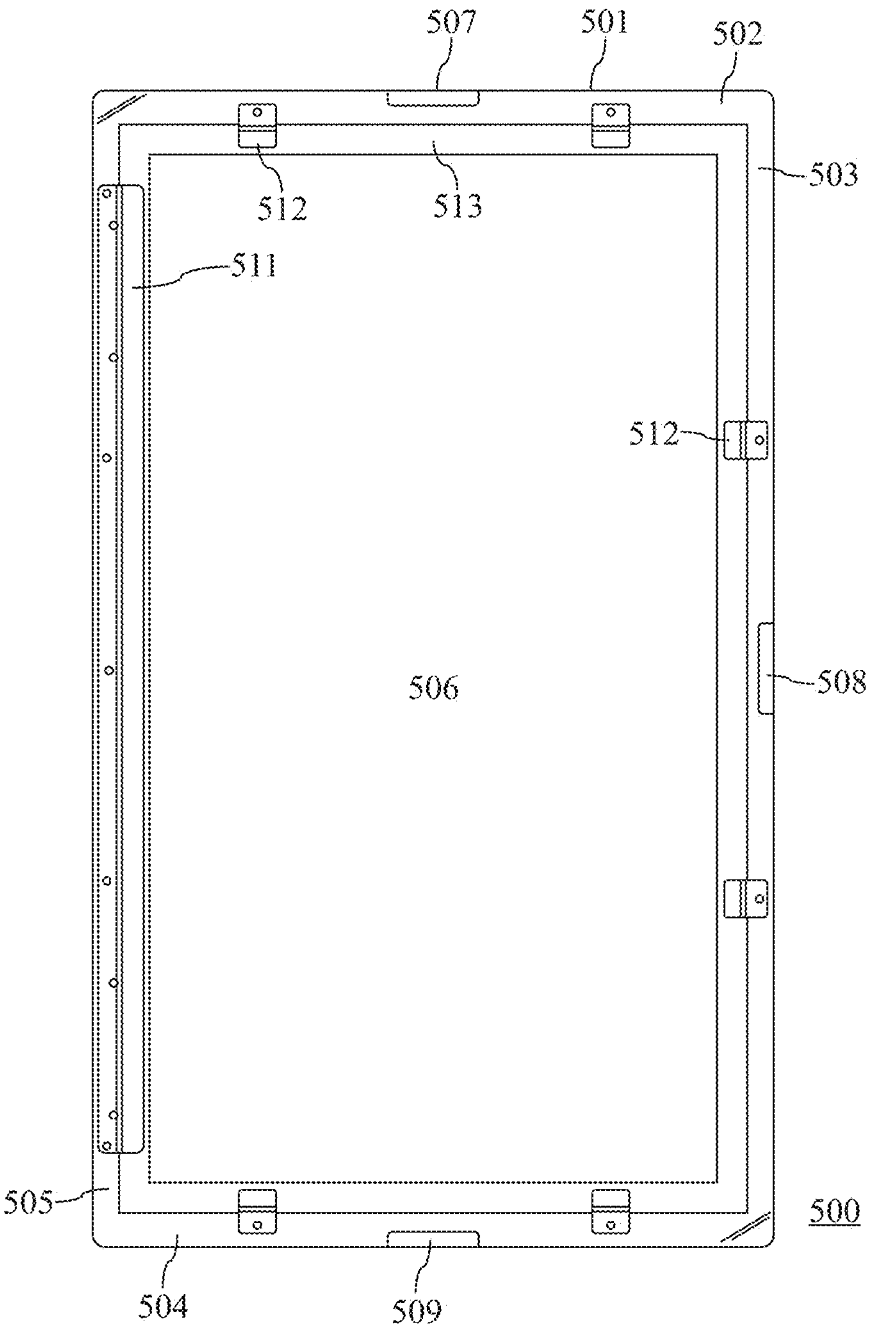
FIG. 4 is a schematic diagram illustrating the multi-specification mounting module included in the present invention.
Figure 5:
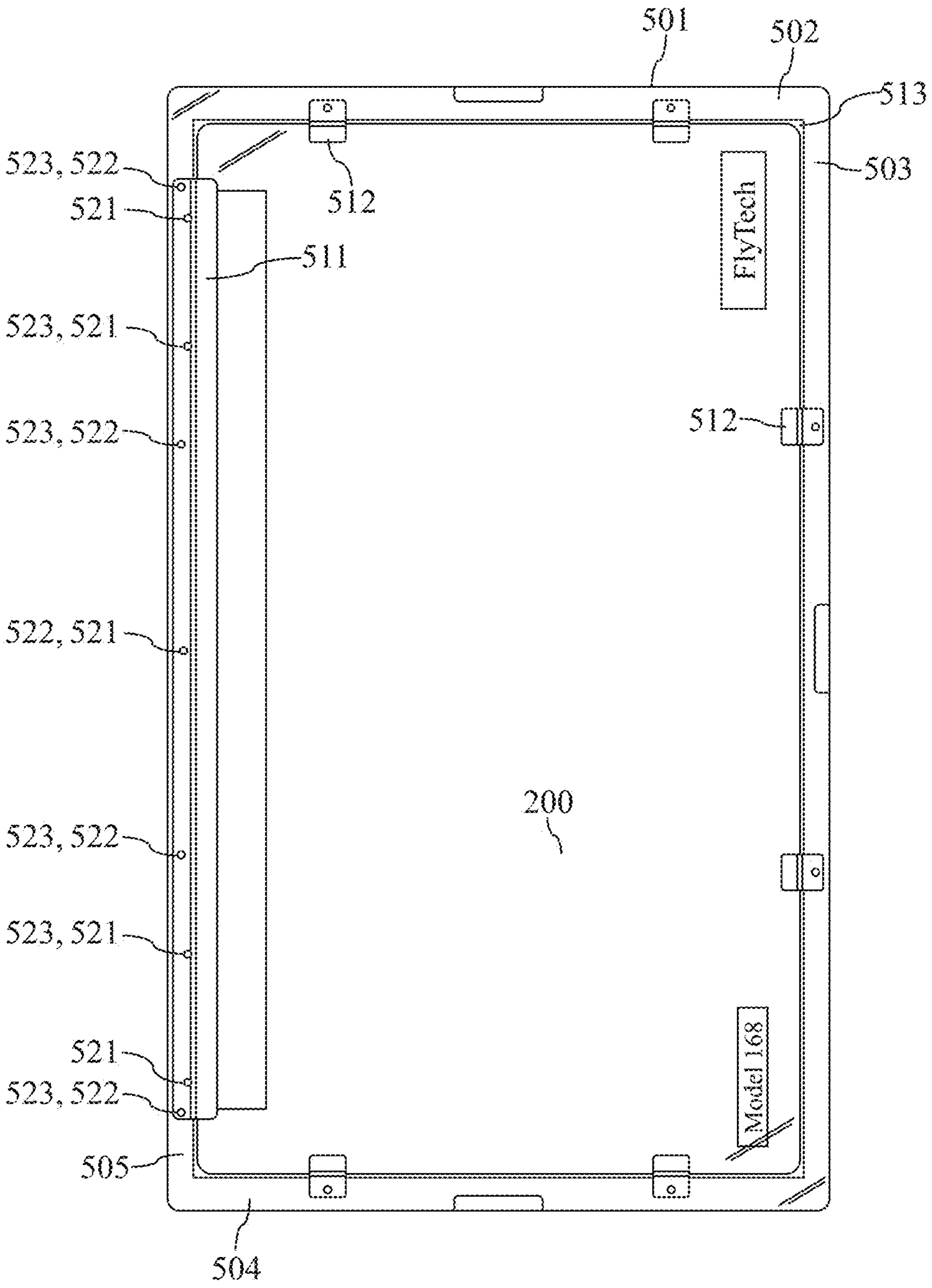
FIG. 5 is a schematic diagram illustrating the structure after the multi-specification mounting module assembled with the display component according to the present invention.

FIG. 4 is a schematic diagram illustrating the multi-specification mounting module included in the present invention; and FIG. 5 is a schematic diagram illustrating the structure after the multi-specification mounting module assembled with the display component according to the present invention. The multi-specification mounting module 500 includes a multi-specification frame base 501, which further includes four frames 502-505. These four frames 502-505 encircle an open area in the center portion to form a display component opening 506. The display component opening 506 preferably has specific dimensions and a geometric shape designed to correspond to the size and shape of the display component 200, so that a variety of display components 200 with different specifications can be placed and arranged within the display component opening 506. The display component opening 506 may be manufactured in a variety of sizes, including but not limited to: 10.1 inches, 11.6 inches, 13.3 inches, 14 inches, 15.1 inches, 15.6 inches, 17 inches, 18.5 inches, 21.5 inches, 27 inches, 28 inches to 32 inches, etc., to accommodate and arrange the various display components 200 with different sizes.

In some embodiments, the frames 502-504 are preferably equipped with peripheral communication connectors 507-509, such as but not limited to USB connectors. The display device modularization kit 100 can further connect to other peripheral devices 800 through these peripheral communication connectors 507-509, including but not limited to: scanners, card readers, swipe card machines, NFC readers, fingerprint sensors, printers, cameras, mice, keyboards, speakers, smart buttons, secondary displays, biometric identifiers, and electronic payment devices, among others.

The multi-specification mounting module 500 preferably further includes at least one universal specification holder 511, the multiple holders 512, and at least one front holder 513. In some embodiments, the universal specification holder 511, the multiple holders 512, and the front holder 513 are preferably made of sheet metal and are attached to the four frames 502-505.

When the display component 200 is installed, the front holder 513 is already pre-attached to the front or the first side of the four frames 502-505. After the display component 200 is configured in the display component opening 506, the universal specification holder 511 and holders 512 are then attached to the rear or the second side of the frames, opposite the first side, by using methods such as but not limited to riveting or screwing, so as to position and secure the display component 200 within a rectangular space defined and formed by the front holder 513, universal specification holder 511, holders 512, and the four frames 502-505, thereby securing the display component 200 to the multi-specification frame base 501.

Preferably, on the universal specification holder 511, multiple sets of positioning connectors, unlimited in number, are pre-configured at different positions in accordance with the various display components 200 with different specifications. Each set of positioning connectors is configured at positions aligned with the respective positioning points or connection points on the various display components 200 with different specifications, so as to use the same universal specification holder 511 to accommodate and attach the various display components 200 with different specifications to the multi-specification frame base 501.

In some embodiments, the universal specification holder 511 includes, but is not limited to, three sets of positioning connectors: the first set of positioning connectors 521, the second set of positioning connectors 522, and the third set of positioning connectors 523. Each set of positioning connectors 521, 522, and 523 corresponds to the positioning points or connection points on the various display components 200 with different specifications from different sources. Thus, in this embodiment, the universal specification holder 511 is capable of accommodating, receiving and linking with, for example, three commonly used display components 200 from different sources (brands).

In some embodiments, the first set of positioning connectors 521, the second set of positioning connectors 522, and the third set of positioning connectors 523, are preferably reduced to practice in the form of openings. However, the form of the positioning connectors is not limited and may include, but is not limited to: grooves, recesses, protrusions, positioning holes, assembly holes, slots, hole positions, openings, blind holes, tenons, clasps, latches, buckles, snap hooks, slots, pins, rings, press studs, circlips, quick-release structures, screws, threaded holes, tapped holes, bolts, nuts, or rivets.

Figure 6:
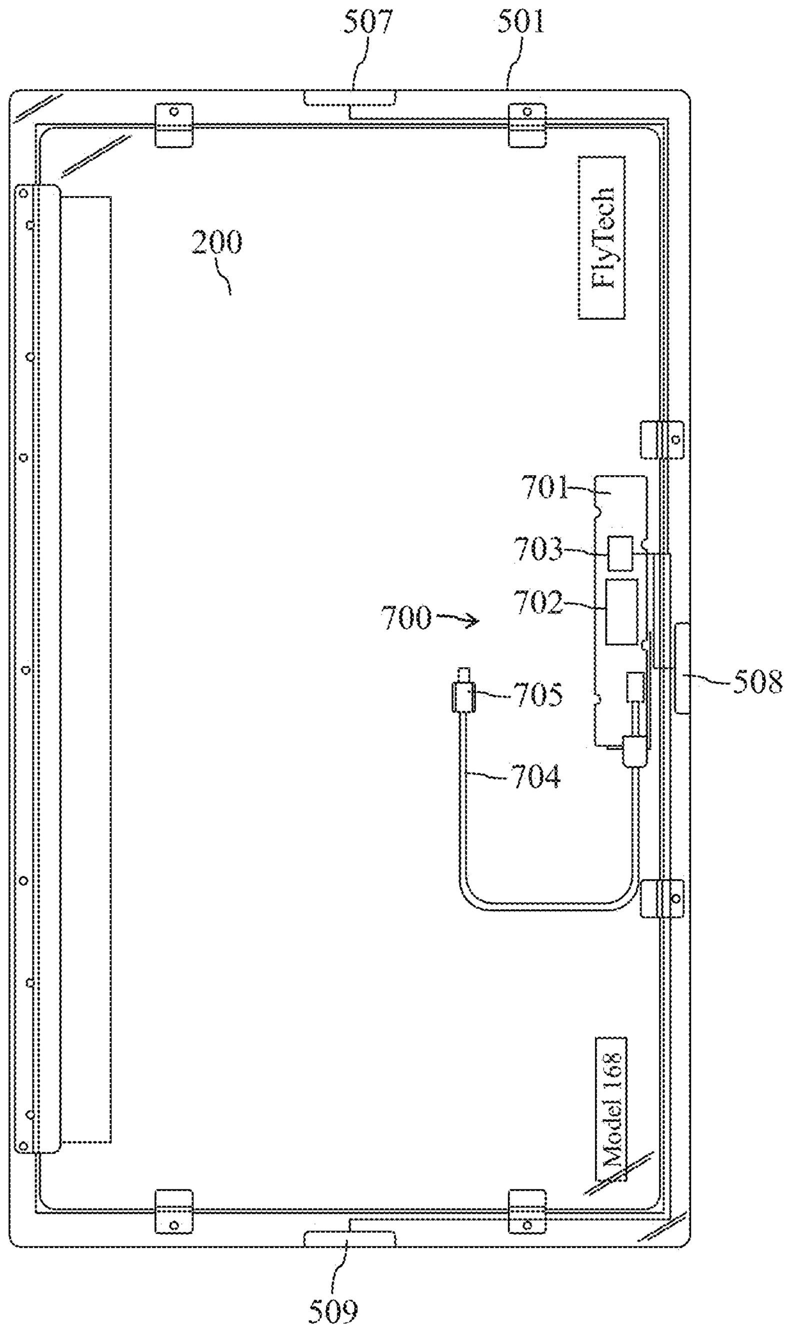
FIG. 6 is a schematic diagram illustrating the unified communication connection module included in the display device modularization kit according to the present invention.

FIG. 6 is a schematic diagram illustrating the unified communication connection module included in the display device modularization kit according to the present invention. The unified communication connection module 700 includes a signal conversion board 701, a transmission line 704, and a second internal transmission connector 705. The signal conversion board 701 is equipped with a signal processing circuit 702, a communication expansion module 703, and a first connector (located below the signal conversion board 701 and not shown). The communication expansion module 703 is preferably a USB expander (USB hub) and is electrically connected to the peripheral communication connectors 507-509 to allocate transmission bandwidth for the peripheral communication connectors 507-509. The first connector is electrically connected to the internal display port of the display component 200, wherein the internal display port preferably includes, but is not limited to, an LVDS display port and an eDP display port.

The port structure configured on the first connector is designed to be compatible with, and connectable to, the various internal display ports of display components 200 with different specifications using a single first connector. For example, larger display components 200 having a diagonal length greater than 18 inches are typically prone to use the LVDS port as their internal display ports, whereas smaller display components 200 having a diagonal length less than 18 inches predominantly use the eDP port. In some embodiments, a single first connector is capable of compatibly connecting to both the LVDS and eDP ports at the same time.

The first connector is electrically connected to the signal processing circuit 702, and the signal processing circuit 702 is further connected to the transmission line 704, so as to finally establish an electrical connection between the first connector and the second internal transmission connector 705. The signal processing circuit 702 is configured to provide, between the first connector and the second internal transmission connector 705, signal processing for signals including but not limited to: audio signals, video signals, LVDS signals, eDP signals, USB signals, ground signals, and power signals. The signal processing covers, but is not limited to: signal conversion, signal integration, signal amplification, signal separation, signal superposition, signal modulation, signal demodulation, signal encoding, signal decoding, and the like.

The transmission line 704 is designed to incorporate and integrate audio signal lines, video signal lines, LVDS signal lines, eDP signal lines, USB transmission lines, ground lines, and power lines into a single transmission line. That is to say, a single transmission line 704 inherently includes audio lines, video lines, LVDS lines, eDP lines, USB lines, ground lines, and power lines, wherein the power lines provide the necessary electrical power for the display component 200 and its backlight module. The second internal transmission connector 705, included in the transmission line 704, is connected to a corresponding single communication connector on the separable control box module 400. In particular, the transmission line 704 includes a ground line therein to render the application-end information system 10 to meet and comply with medical-grade device standards to be a qualified medical-grade device.

Preferably, the unified communication connection module 700 is designed and configured to use only a single first connector, a single transmission line 704, and a single second internal transmission connector 705, to transmit all electronic signals between the frontend module 300 or the separable control box module 400 with each other, to realize a bidirectional communication connection between the frontend module 300 and the separable control box module 400, and to unify the communication interface between the frontend module 300 and the separable control box module 400. Therefore, a communication connection between the frontend module 300 and the separable control box module 400 can be easily and quickly established by using only a single transmission line, thereby streamlining the communication setup therebetween.

Figure 7:
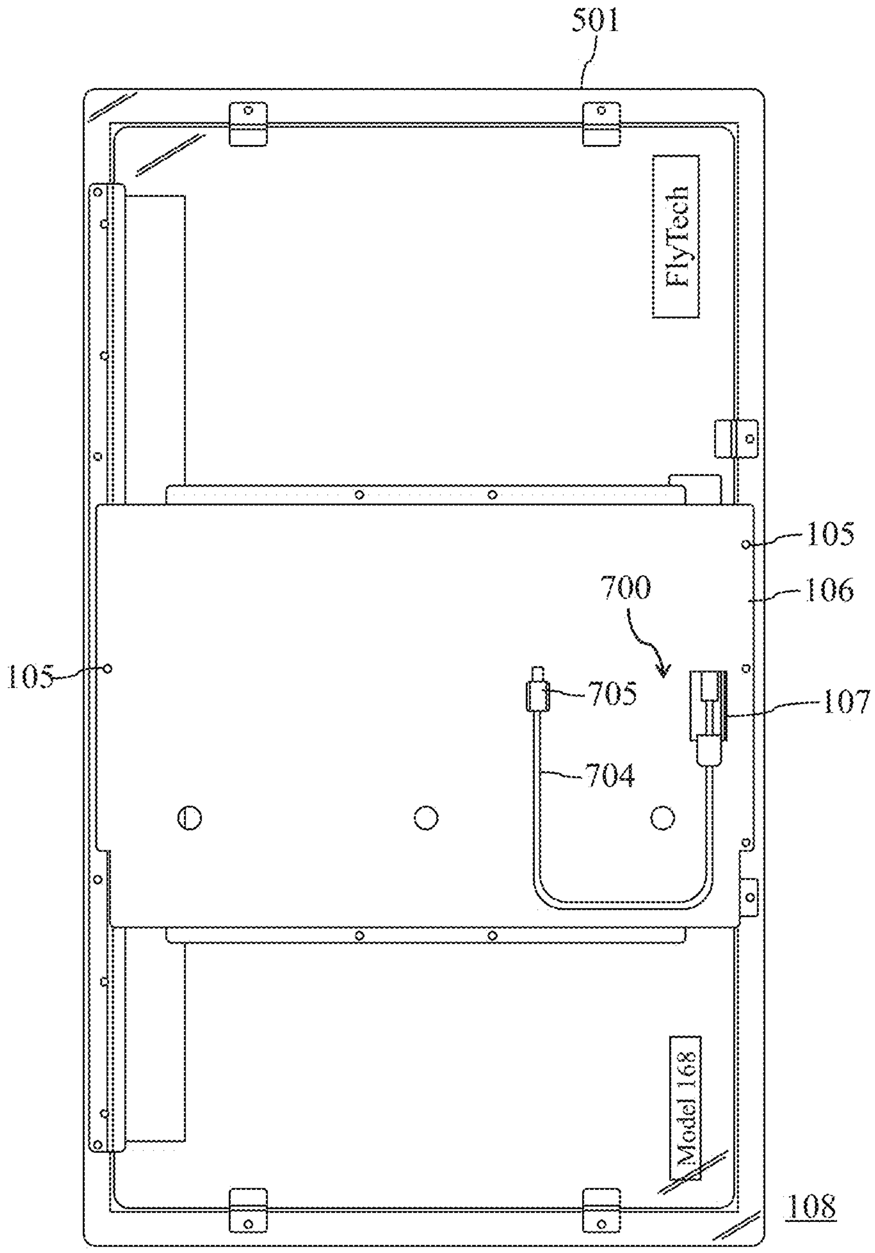
FIG. 7 is a schematic diagram illustrating the rear support included in the display device modularization kit according to the present invention.

FIG. 7 is a schematic diagram illustrating the rear support included in the display device modularization kit according to the present invention. The unified communication connection module 700 is preferably attached to the rear support 106, and the rear support 106 is then connected to the multi-specification frame base 501 via multiple connectors 105, such as screws, to secure the unified communication connection module 700 to the multi-specification frame base 501. The rear support 106 also functions as a cover plate, to hide the metal back cover of the display component 200. In addition, the rear support 106 further includes a transmission line opening 107, through which the transmission line 704 and the second connector 224 are exposed.

When the display component 200 and the multi-specification frame base 501 are successfully assembled, the display component 200, the multi-specification frame base 501, the rear support 106, and the unified communication connection module 700 collectively form a display assembly 108.

Figure 8:
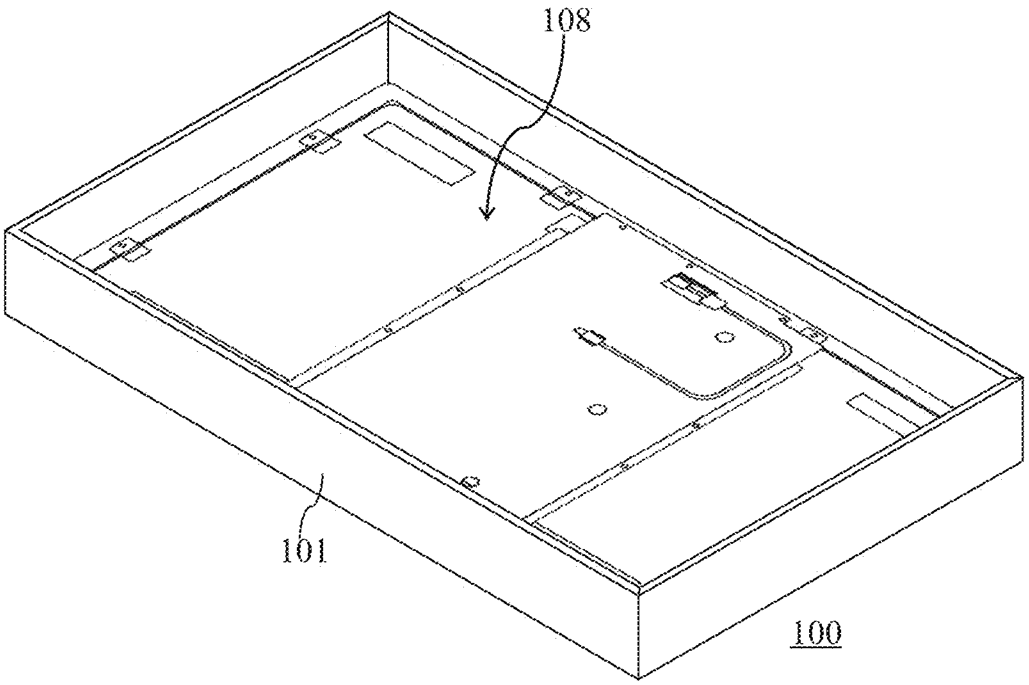
FIG. 8 is a schematic diagram illustrating the display assembly and the first housing included in the present invention.

FIG. 8 is a schematic diagram illustrating the display assembly and the first housing included in the present invention. The display device modularization kit 100 includes a first housing 101, which functions as a front housing. The display assembly 108 is installed and secured in the first housing 101 through multiple connectors (not shown) configured on the first housing 101.

Figure 9:
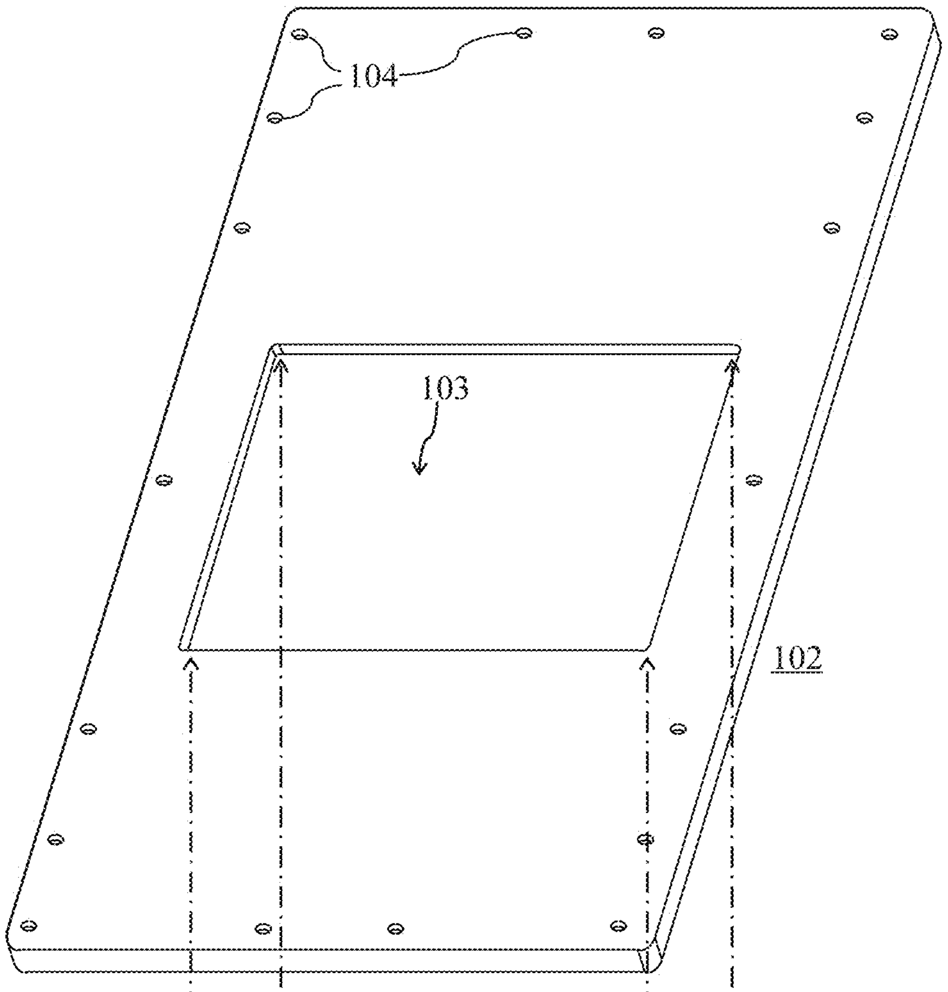
FIG. 9 is a schematic diagram illustrating the second housing included in the display device modularization kit according to the present invention.
Figure 10:
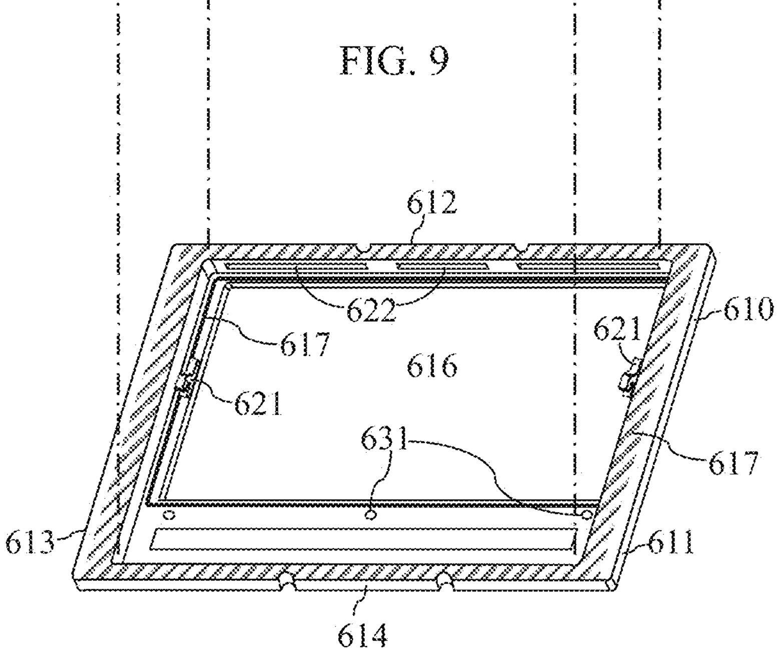
FIG. 10 is a schematic diagram illustrating the linking substrate included in the modularization kit according to the present invention.
Figure 11:
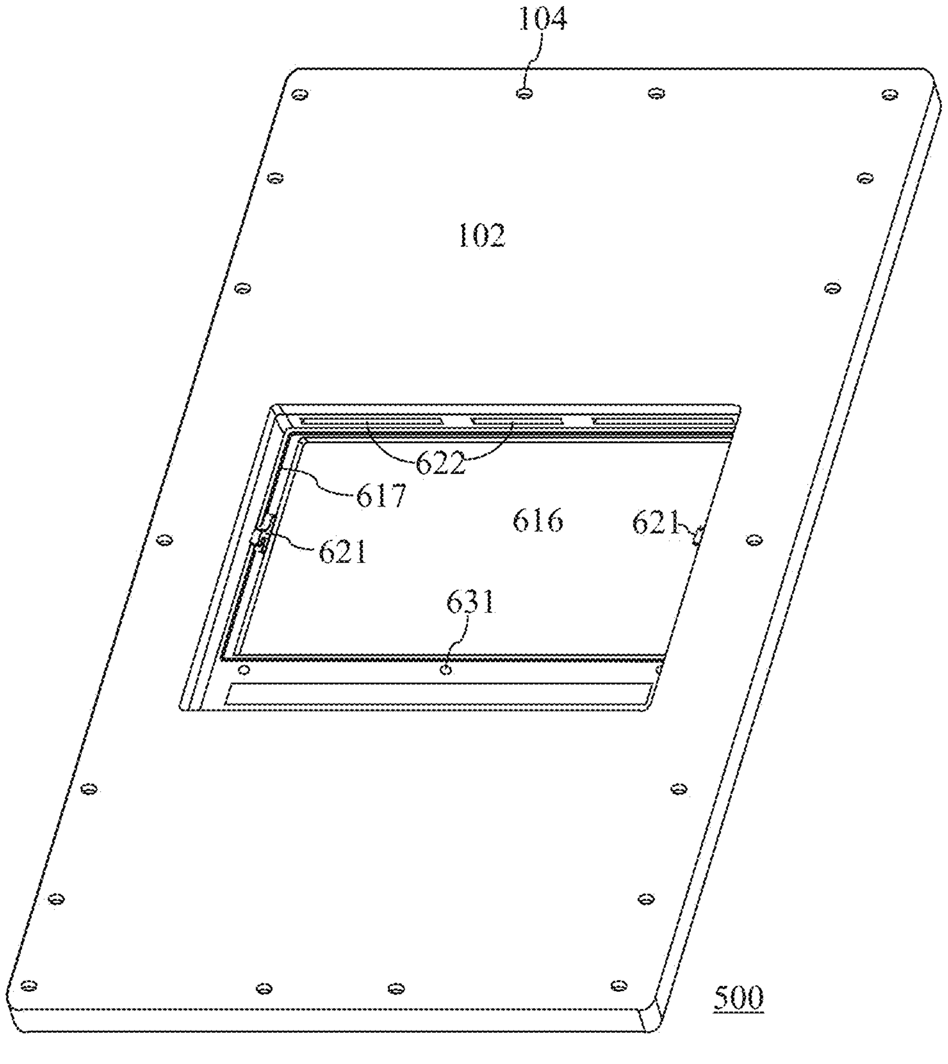
FIG. 11 is a schematic diagram illustrating the second housing and the linking substrate according to the present invention.
Figure 12:
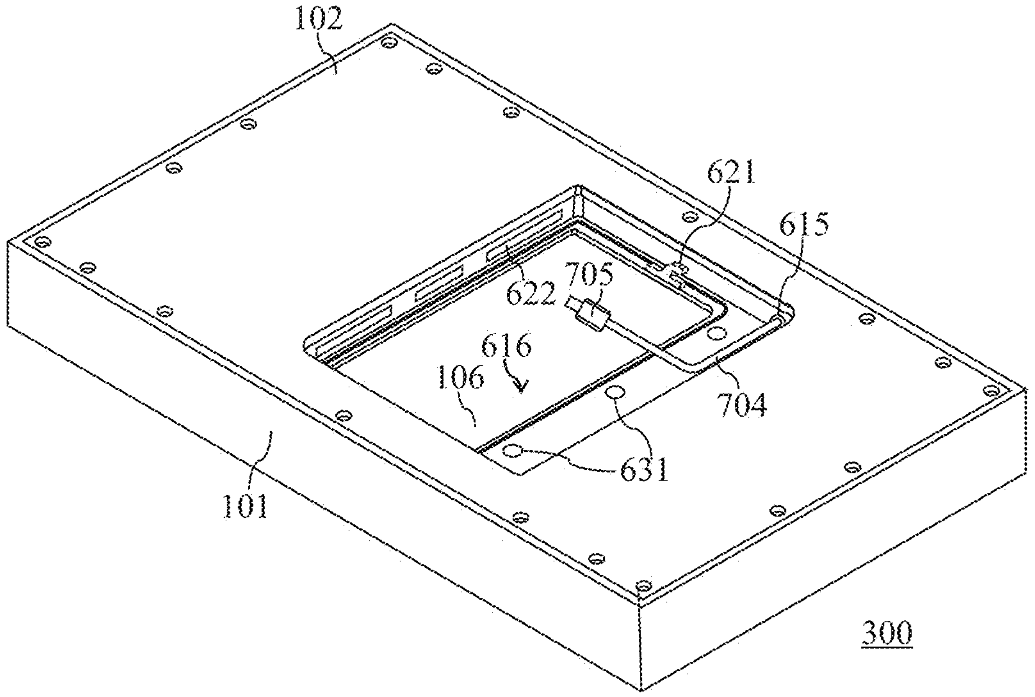
FIG. 12 is a schematic diagram illustrating the frontend module included in the present invention.

FIG. 9 is a schematic diagram illustrating the second housing included in the display device modularization kit according to the present invention; FIG. 10 is a schematic diagram illustrating the linking substrate included in the modularization kit according to the present invention; FIG. 11 is a schematic diagram illustrating the second housing and the linking substrate according to the present invention; and FIG. 12 is a schematic diagram illustrating the frontend module included in the present invention. The display device modularization kit 100 further includes a second housing 102, which functions as a rear plate, and is assembled with the first housing 101 to form a rectangular housing space capable of accommodating the display component 200.

The multi-specification linking module 600 includes a linking substrate 610, multiple first engaging components 621 configured at the first edge 611 and the third edge 613 included in the linking substrate 610, multiple second engaging components 622 configured at the second edge 612 included in the linking substrate 610, and multiple first fastening components 631 configured at the fourth edge 614 included in the linking substrate 610. The linking substrate 610 further includes a wiring opening 615 and a central opening 616, wherein the wiring opening 615 provides the transmission line 704 and the second internal transmission connector 705, to be exposed for further communicative connection to the separable control box module 400.

The first engaging components 621 and the second engaging components 622 are preferably reduced to practice in forms including but not limited to: grooves, recesses, protrusions, positioning holes, assembly holes, slots, hole positions, openings, blind holes, tenons, clasps, latches, buckles, snap hooks, slots, pins, rings, press studs, quick-release structures, or circlips. In this embodiment, the first engaging components 621 are preferably a pair of snap hooks, and the second engaging components 622 are preferably a pair of slots in the form of blind holes.

The first fastening components 631 are preferably in forms such as but not limited to: positioning holes, assembly holes, hole positions, openings, screws, threaded holes, tapped holes, bolts, nuts, rivets, or circlips. In this embodiment, the first fastening components 631 are preferably multiple tapped holes.

The second housing 102 further includes a linking substrate opening 103 preferably in a rectangular shape and multiple openings 104. The linking substrate opening 103 is designed to receive and configure the linking substrate 610. The linking substrate opening 103 has a geometric shape corresponding to that of the linking substrate 610, to provide the the linking substrate 610 to be accommodated and configured therein. The linking substrate 610 is preferably attached to the linking substrate opening 103 by adhesive bonding or screwing, so as to be attached to the second housing 102.

In some embodiments, the linking substrate 610 is bonded to the second housing 102 through a ring of waterproof adhesive layer 617 coated around the four edges thereof, to prevent moisture or droplets from entering the internal space of the frontend module 300 via the central opening 616. Surrounding the central opening 616, a ring of waterproof element 618, preferably in the form of, for example, but not limited to, a rubber O-ring, is further configured. After the linking substrate 610 is successfully bonded to the second housing 102, it ensures that moisture and droplets do not infiltrate the internal space of the frontend module 300, when the first housing 101 and the second housing 102 are successfully assembled together, as well as when the separable control box module 400 and the frontend module 300 are successfully assembled together.

In some embodiments, the linking substrate 610 and the second housing 102 are individual components that are separate and independent from each other, in oder to render the multi-specification linking module 600, including the linking substrate 610, to be easily attached to the various second housings 102 with different specifications, as different materials, including but not limited to: stainless steel, die-cast materials, or plastic, are possibly used to manufacture the second housing 102 for the various frontend modules 300 with different specifications.

In some embodiments, the multi-specification linking module 600, including the linking substrate 610, multiple first engaging components 621, multiple second engaging components 622, and multiple first fastening components 631, may be directly fabricated and formed on the second housing 102 by methods such as, but not limited to, integral molding or injection molding, to be incorporated into the second housing 102, to become an integral part of the second housing 102.

The second housing 102 and the first housing 101 are assembled by using methods such as, but not limited to, screwing. In some embodiments, the first housing 101 includes multiple tapped holes (not shown) corresponding to the positions of multiple openings 104 on the second housing 102, to provide the second housing 102 to be assembled with the first housing 101 by using screws to form the frontend module 300. Due to the configuration of the rear support 106, when the second housing 102 is assembled with the first housing 101, only the rear support 106 is visible through the central opening 616, and the metal back cover of the display component 200 is hidden by the rear support 106.

Figure 13:
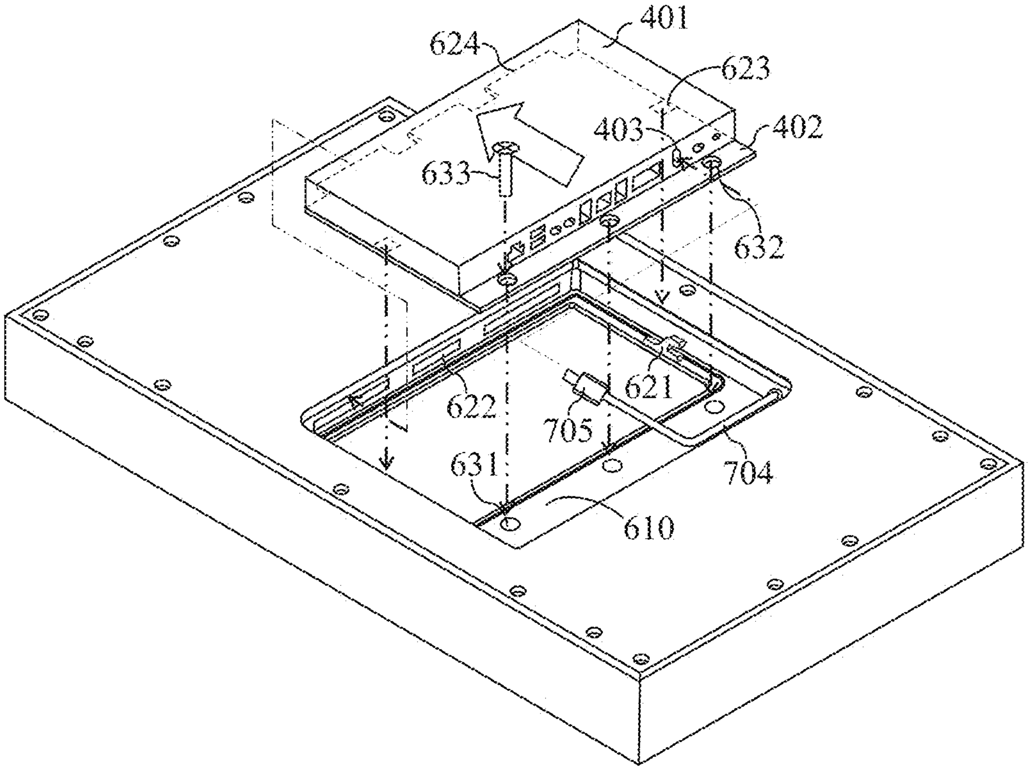
FIG. 13 is a schematic diagram illustrating the connection relationship between the separable control box and the frontend module according to the present invention.
Figure 14:
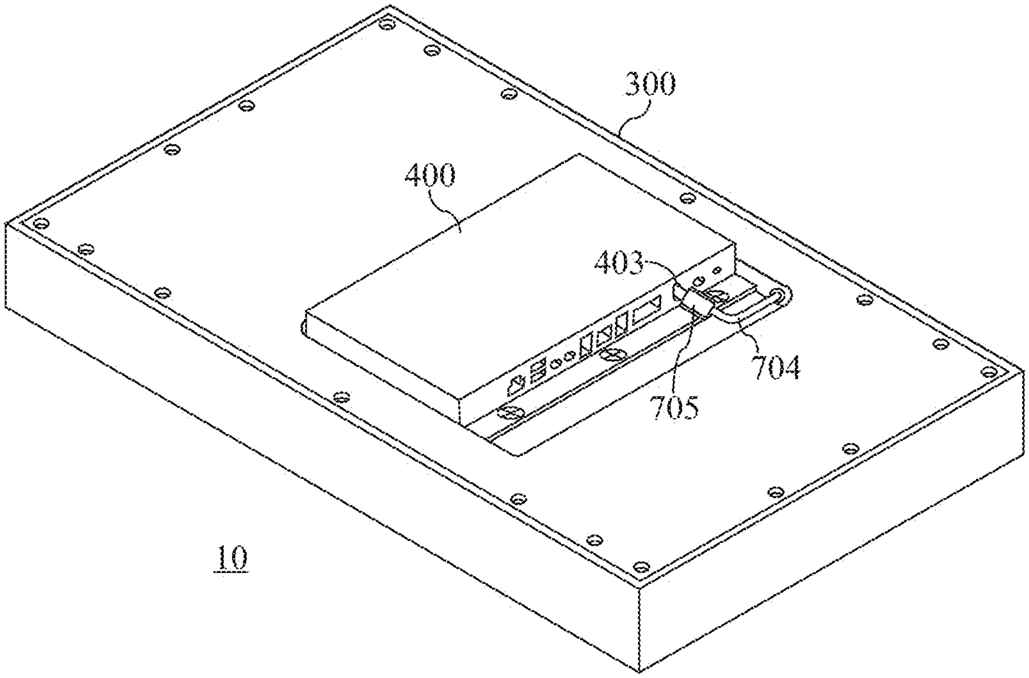
FIG. 14 is a schematic diagram illustrating the separable control box and the frontend module that are physically linked and unifiedly communicatively connected to each other according to the present invention.

FIG. 13 is a schematic diagram illustrating the connection relationship between the separable control box and the frontend module according to the present invention; and FIG. 14 is a schematic diagram illustrating the separable control box and the frontend module that are physically linked and unifiedly communicatively connected to each other according to the present invention. The separable control box module 400 includes the first cover 401, which functions as a top cover, and the second cover 402, which functions as a bottom cover. After the first cover 401 and the second cover 402 are assembled, an internal box-shaped rectangular space is formed accordingly to accommodate the main control circuit board.

The main control circuit board is preferably configured with components including but not limited to: a basic input/output system (BIOS), processor, an embedded controller (EC), a random access memory (RAM), a storage medium such as a solid-state drive (SSD), an SD memory card, or mechanical hard drive, a power management module, a speaker, a network power supply module, a cooling unit, and a unified communication interface, to provide particular functionalities and to drive and control the display component 200. The main control circuit board further includes a single internal communication connector 403.

The first cover 401 is configured with multiple fourth engaging components 624 and multiple second fastening components 632, while the second cover 402 is configured with multiple third engaging components 623. A pair of the third engaging components 623 correspond to a pair of the first engaging components 621 on the linking substrate 610, the multiple fourth engaging components 624 correspond to the multiple second engaging components 622 on the linking substrate 610, and the multiple second fastening components 632 correspond to the multiple first fastening components 631 on the linking substrate 610.

The third engaging components 623 and the fourth engaging components 624 are reduced to practice in forms such as, but not limited to: grooves, recesses, protrusions, positioning holes, assembly holes, slots, hole positions, openings, blind holes, tenons, clasps, fasteners, latches, buckles, snap hooks, slots, pins, rings, press studs, quick releases, circlips, or quick-release structures. In some embodiments, the third engaging components 623 are preferably a pair of slots, and the fourth engaging components 624 are preferably a pair of tenons.

The second fastening components 632 are preferably in forms such as, but not limited to: positioning holes, assembly holes, hole positions, openings, screws, threaded holes, tapped holes, bolts, nuts, rivets, or circlips. In this embodiment, the second fastening components 632 are preferably multiple openings.

When the separable control box module 400 is managed to be combined with the frontend module 300, it is only necessary to simply align and insert the multiple third engaging components 623 to the multiple first engaging components 621, and then correspondingly, the multiple fourth engaging components 624 are automatically aligned with the multiple second engaging components 622. Next, by gently moving the separable control box module 400 upward, the multiple fourth engaging components 624 are automatically inserted into the multiple second engaging components 622, and at the same time, the the multiple third engaging components 623 and the multiple first engaging components 621 are automatically engaged with each other. Finally, by manually fine-tuning the position of the separable control box module 400 to align the multiple second fastening components 632 with the multiple first fastening components 631, and then using fasteners 633, such as but not limited to screws, to pass through the multiple second fastening components 632 and screw into the multiple first fastening components 631, the separable control box module 400 is securely fastened and installed on the frontend module 300.

The fasteners 633 are preferably in forms such as, but not limited to: positioning holes, assembly holes, hole positions, openings, screws, threaded holes, tapped holes, bolts, nuts, rivets, or circlips. In some embodiments, the fasteners 633 are preferably screws.

The integral multi-specification linking module 600 is distributed across the frontend module 300 and the separable control box module 400, and includes the linking substrate 610, the first engaging components 621, the second engaging components 622, and the first fastening components 631 configured on the linking substrate 610, the fourth engaging components 624 and the second fastening components 632 configured on the first cover 401, and the third engaging components 623 and fasteners 633 configured on the second cover 402.

When the separable control box module 400 and the frontend module 300 are successfully assembled with each other, the waterproof element 618 ensures that moisture and droplets do not enter the interior space of the frontend module 300, to create a water-sealing condition within the frontend module 300.

As long as the second internal transmission connector 705 included in the frontend module 300 is simply plugged into the corresponding single internal communication connector 403 on the separable control box module 400, a unified and quick communication connection between the separable control box module 400 and the frontend module 300 is formed and enabled by using only a single transmission line 704.

In summary, the display device modularization kit 100 including the multi-specification mounting module 500 and the multi-specification linking module 600 is capable of physically linking any display components 200 with different specifications in a modularized manner, and further integrating and unifying the peripheral devices 800 and the separable control box module 400 through the unified communication connection module 700 to realize a unified communication interface between modules with different specifications, to ultimately form the application-end information systems 10.

Any separable control box module 400 with different specifications, as long as it is configured with the linking module 600, can be universally physically linked with and establish a unified communication connection with any integrated frontend modules 300 with different specifications, which effectively facilitates easy replacement, exchange, and combination among a variety of display components 200 and a variety of separable control box modules 400 with different specifications, to form a variety of application-end information systems 10 with versatile functionalities.

As compared to traditional information systems in which the entire display component, the speaker, and the entire main control circuit board including the processor, the memory, and the storage media are all encapsulated in the same housing, making the entire information system difficult to maintain and upgrade, the present invention modularizes the main control circuit board and the display component for modular configuration, and then separates the main control circuit board and the display component after modularization.

In the present invention, various electronic components including the main control circuit board are separately deployed in a separate control box module 400 that is separated from the frontend module 300 containing the display component, so that various display components 200 with different sizes and different operating principles from different manufacturers, as well as the separate control box module 400 with different architectures, different performance and different sizes from different manufacturers, are compatible with each other and can be quickly assembled together to form various application terminal information systems 10.

For example, even large-sized display panels can be flexibly matched with smaller or lower-level control boxes according to different tasks without any restrictions; conversely, small-sized panels can also be flexibly matched with high-level control boxes according to different tasks. Users can also upgrade the control box at any time without changing the display panel, which helps reduce system construction costs for users. In addition, users can switch the control box to a low-power ARM architecture control box at any time.

Furthermore, since the main control circuit board is to be independently formed into a separate control box when various electronic components fail or need to be upgraded, compared to traditional information systems that require disassembly of the entire large system, especially for security considerations, traditional information systems prefer to encapsulate the electronic controller at the bottom of the housing, which makes maintenance difficult. The present invention requires only a simple disassembly of the control box to remove the main control board for repairing or upgrading various electronic components.

For the production end, when assembling the application-end information system 10 provided by the present invention, various display components 200 with different sizes and operating principles from different manufacturers, various peripheral devices 800 with different specifications, and control box modules 400 with different architectures, performance, and sizes from different manufacturers can be flexibly matched, so that the assembly and production for the application-end information systems 10 is not affected by material shortages or supply-side restrictions.

For maintenance and consumer ends, the advantages raised in the present invention are significant. When various components included in the information system 10, from display components 200, various peripheral devices 800 to control box modules 400, fail, malfunction or need to be upgraded, other components with different specifications can be freely replaced in a timely manner, completely unaffected by material shortages or supply-side restrictions.

The present invention also has the following advantages: (1) signal communication uses only one transmission line for simple and fast connection; (2) the front half of the system contains panel, touch, camera, peripheral devices, and Fedp conversion, which can be freely transformed into different product applications such as POS, kiosk, panel PC, SOC; (3) unified signal interfaces can improve product compatibility; (4) increase factory production flexibility; (5) facilitate flexible bulk purchasing by end customers, thereby increasing competitiveness; (6) convenient inventory management reduces costs; and (7) especially suitable for commercial information systems.

There are further embodiments provided as follows.

Embodiment 1: A display device modularization kit, which provides a modularized physical linkage and a unified communication connection for a frontend module with different specifications and a separable control box module with different specifications, includes: a multi-specification mounting module configured to link a display component with different specifications to form the frontend module; and a unified communication connection module including a first connector and a single transmission line, wherein the first connector is configured to communicatively connect with an internal display port with different specifications included in the display component and the single transmission line is configured to communicatively connect with a single internal communication connector included in the separable control box module.

Embodiment 2: The display device modularization kit as described in embodiment 1, further includes: a multi-specification linking module configured to link the separable control box module with different specifications and including: a linking substrate configured on a second housing included in the frontend module and including a first edge, a second edge, a third edge, a fourth edge, and a wiring opening; a first engaging component configured on the first and third edges; a second engaging component configured on the second edge; and a first fastening component configured on the fourth edge.

Embodiment 3: The display device modularization kit as described in embodiment 2, the multi-specification linking module further includes: on the separable control box module: a third engaging component, a fourth engaging component, and a second fastening component configured on one of a first cover and a second cover included in the separable control box module; the third engaging component corresponding to the first engaging component; the fourth engaging component corresponding to the second engaging component; and the second fastening component corresponding to the first fastening component.

Embodiment 4: The display device modularization kit as described in embodiment 1, the multi-specification mounting module further includes: a multi-specification frame base including a plurality of frames and a display component opening; a front holder attached to a first side of the frames; a holder attached to a second side of the frames; a universal specification holder attached to the second side of the frame, wherein the first side is opposite to the second side; and a plurality of peripheral communication connectors configured on the frames for external connection with a plurality of peripheral devices.

Embodiment 5: The display device modularization kit as described in embodiment 4, the multi-specification mounting module further includes: the universal specification holder further including a plurality of positioning connectors, each of which the plurality of positioning connectors corresponding to a positioning point or a connection point included in the display component with different specifications; and the display component is configured in a rectangular space formed by the display component opening, the front holder, the holder, and the universal specification holder.

Embodiment 6: The display device modularization kit as described in embodiment 4, the unified communication connection module further includes: a signal conversion board configured to include the first connector and a communication expansion module; the single transmission line electrically connected to the first connector and having a single second internal transmission connector; the single second internal transmission connector configured to communicatively connect with the single internal communication connector included in the separable control box module; and the communication expansion module communicatively connected to the a plurality of peripheral communication connectors to allocate bandwidth therefor.

Embodiment 7: The display device modularization kit as described in embodiment 6, the single transmission line includes one of an audio signal line, a video signal line, an LVDS signal line, an eDP signal line, a USB transmission line, a ground line, and a power line.

Embodiment 8: The display device modularization kit as described in embodiment 1, the internal display port is one of an LVDS port and an eDP port.

Embodiment 9: The display device modularization kit as described in embodiment 8, the first connector is configured to be compatible and communicatively connectable with the LVDS port and the eDP port with different specifications.

Embodiment 10: The display device modularization kit as described in embodiment 1, the separable control box module further includes: the single internal communication connector configured to accept an electrical connection from the single second internal transmission connector from the frontend module in order to have a unified signal interface with the frontend module, so as to unify a communication interface between the frontend module and the separable control box module.

Embodiment 11: An information system modularization kit, which provides a modularized physical linkage and a unified communication connection for a frontend module with different specifications and a separable control box module with different specifications, includes: a multi-specification mounting module configured to link a display component with different specifications to form the frontend module; and a unified communication connection module including a first connector and a single transmission line, wherein the first connector is configured to communicatively connect with an internal display port with different specifications included in the display component and the single transmission line is configured to communicatively connect with a single internal communication connector included in the separable control box module.

Embodiment 12: An information system, which provides a modularized physical linkage and a unified communication connection for a frontend module with different specifications and a separable control box module with different specifications, includes: a multi-specification mounting module configured to link a display component with different specifications to form the frontend module; and a unified communication connection module including a first connector and a single transmission line, wherein the first connector is configured to communicatively connect with an internal display port with different specifications included in the display component and the single transmission line is configured to communicatively connect with a single internal communication connector included in the separable control box module.

While the disclosure has been described in terms of what are presently considered to be the most practical and preferred embodiments, it is to be understood that the disclosure need not be limited to the disclosed embodiments. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present disclosure which is defined by the appended claims.

What is claimed is:

1. A display device modularization kit, which provides a modularized physical linkage and a unified communication connection for a frontend module with different specifications and a separable control box module with different specifications, comprising:

- a multi-specification compatible mounting module configured to compatibly link a display component, selected from a group of display components with different specifications, and form a rectangular box-type enclosed space, defined by a front holder, a universal specification holder comprising a plurality of positioning connectors, and a plurality of frames, to position and secure the display component therewithin, so as to form the frontend module; and
- a unified communication connection module comprising a first single connector and a single transmission line, wherein the first single connector is configured to compatibly and communicatively connect with either an eDP internal display port or a LVDS internal display port comprised in the display component and the single transmission line is configured to communicatively connect with a single internal communication connector comprised in the separable control box module.

2. The display device modularization kit as claimed in claim 1, further comprising:

- a multi-specification linking module configured to link the separable control box module with different specifications and comprising:
  - a linking substrate configured on a second housing comprised in the frontend module and comprising a first edge, a second edge, a third edge, a fourth edge, and a wiring opening;
  - a first engaging component configured on the first and third edges;
  - a second engaging component configured on the second edge; and
  - a first fastening component configured on the fourth edge.

3. The display device modularization kit as claimed in claim 2, wherein the multi-specification linking module further comprises:

on the separable control box module:

- a third engaging component, a fourth engaging component, and a second fastening component configured on one of a first cover and a second cover comprised in the separable control box module;
- the third engaging component corresponding to the first engaging component;
- the fourth engaging component corresponding to the second engaging component; and
- the second fastening component corresponding to the first fastening component.

4. The display device modularization kit as claimed in claim 1, wherein the multi-specification compatible mounting module further comprises:

- a multi-specification frame base comprising the plurality of frames and a display component opening;
- the front holder attached to a first side of the plurality of frames;
- a holder attached to a second side of the plurality of frames;
- the universal specification holder attached to the second side of the plurality of frame, wherein the first side is opposite to the second side; and
- a plurality of peripheral communication connectors configured on the plurality of frames for external connection with a plurality of peripheral devices.

5. The display device modularization kit as claimed in claim 4, wherein the multi-specification compatible mounting module further comprises:

- the universal specification holder further comprising the plurality of positioning connectors, each of which the plurality of positioning connectors corresponding to a positioning point or a connection point comprised in the display component with different specifications; and
- the display component is configured in the rectangular box-type space formed by the display component opening, the front holder, the holder, and the universal specification holder.

6. The display device modularization kit as claimed in claim 4, wherein the unified communication connection module further comprises:

- a signal conversion board configured to comprise the first single connector and a communication expansion module;
- the single transmission line electrically connected to the first single connector and having a single second internal transmission connector;
- the single second internal transmission connector configured to communicatively connect with the single internal communication connector comprised in the separable control box module; and
- the communication expansion module communicatively connected to the plurality of peripheral communication connectors to allocate bandwidth therefor.

7. The display device modularization kit as claimed in claim 6, wherein the single transmission line comprises one of an audio signal line, a video signal line, a LVDS signal line, an eDP signal line, a USB transmission line, a ground line, and a power line.

8. The display device modularization kit as claimed in claim 1, wherein the separable control box module further comprises:

the single internal communication connector configured to accept an electrical connection from the single second internal transmission connector from the frontend module in order to have a unified signal interface with the frontend module, so as to unify a communication interface between the frontend module and the separable control box module.

9. An information system modularization kit, which provides a modularized physical linkage and a unified communication connection for a frontend module with different specifications and a separable control box module with different specifications, comprising:

a multi-specification compatible mounting module configured to compatibly link a display component, selected from a group of display components with different specifications, and form a rectangular box-type enclosed space, defined by a front holder, a universal specification holder comprising a plurality of positioning connectors, and a plurality of frames, to position and secure the display component therewithin, so as to form the frontend module; and a unified communication connection module comprising a first single connector and a single transmission line, wherein the first single connector is configured to compatibly and communicatively connect with either an eDP internal display port or a LVDS internal display port comprised in the display component and the single transmission line is configured to communicatively connect with a single internal communication connector comprised in the separable control box module.

10. An information system, which provides a modularized physical linkage and a unified communication connection for a frontend module with different specifications and a separable control box module with different specifications, comprising:

a multi-specification compatible mounting module configured to compatibly link a display component, selected from a group of display components with different specifications, and form a rectangular box-type enclosed space, defined by a front holder, a universal specification holder comprising a plurality of positioning connectors, and a plurality of frames, to position and secure the display component therewithin, so as to form the frontend module; and a unified communication connection module comprising a first single connector and a single transmission line, wherein the first single connector is configured to compatibly and communicatively connect with either an eDP internal display port or a LVDS internal display port comprised in the display component and the single transmission line is configured to communicatively connect with a single internal communication connector comprised in the separable control box module.

* * * * *